US009571125B2

(12) United States Patent
Lee et al.

(10) Patent No.: US 9,571,125 B2
(45) Date of Patent: Feb. 14, 2017

(54) SYSTEMS AND METHODS OF VECTOR-DMA CACHE-XOR FOR MPCC ERASURE CODING

(71) Applicant: Futurewei Technologies, Inc., Plano, TX (US)

(72) Inventors: Xiaobing Lee, Santa Clara, CA (US); Chunlei Dong, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 156 days.

(21) Appl. No.: 14/505,328

(22) Filed: Oct. 2, 2014

(65) Prior Publication Data

US 2015/0100860 A1    Apr. 9, 2015

Related U.S. Application Data

(60) Provisional application No. 61/886,480, filed on Oct. 3, 2013.

(51) Int. Cl.
| | | |
|---|---|---|
| *H03M 13/00* | (2006.01) | |
| *H03M 13/23* | (2006.01) | |
| *G06F 13/28* | (2006.01) | |
| *H03M 13/37* | (2006.01) | |
| *G06F 12/08* | (2016.01) | |

(52) U.S. Cl.
CPC ........ *H03M 13/235* (2013.01); *G06F 12/0875* (2013.01); *G06F 13/28* (2013.01); *H03M 13/373* (2013.01); *G06F 12/0868* (2013.01); *G06F 2212/403* (2013.01); *G06F 2212/603* (2013.01)

(58) Field of Classification Search
None
See application file for complete search history.

(56) References Cited

U.S. PATENT DOCUMENTS

| | | | |
|---|---|---|---|
| 4,205,324 A | 5/1980 | Patel | |
| 6,460,122 B1 * | 10/2002 | Otterness | G06F 11/1076 711/122 |
| 6,513,142 B1 * | 1/2003 | Noya | G06F 11/1076 711/113 |
| 7,209,979 B2 * | 4/2007 | Solomon | G06F 3/0613 709/249 |
| 7,716,566 B2 | 5/2010 | Lee et al. | |
| 7,882,425 B2 | 2/2011 | Lee et al. | |
| 8,205,144 B1 * | 6/2012 | Yadav | H03M 13/1111 714/785 |
| 8,438,344 B2 * | 5/2013 | Kumar | G06F 11/1052 365/189.02 |
| 2010/0161914 A1 * | 6/2010 | Eilert | G06F 9/467 711/154 |

\* cited by examiner

*Primary Examiner* — Daniel McMahon
(74) *Attorney, Agent, or Firm* — Slater Matsil, LLP

(57) ABSTRACT

System and method embodiments are provided for managing storage systems. In an embodiment, a network component for managing data storage includes a storage interface configured to couple to a plurality of storage devices; and a vector-direct memory access (DMA) cache-exclusive OR (XOR) engine coupled to the storage interface and configured for a multiple parities convolution codes (MPCC) erasure coding to accelerate M parities parallel calculations and the erasures cross-iterations decoding, wherein a single XOR-engine with caches and a vector-DMA address generator is shared by the MPCC erasure coding engine for pipelining external dual data rate (DDR4) memory accesses, where M is a positive integer greater than two.

25 Claims, 9 Drawing Sheets

SYSTEMS AND METHODS OF VECTOR-DMA CACHE-XOR FOR MPCC ERASURE CODING

CROSS-REFERENCE TO RELATED APPLICATIONS

The present application claims the benefit of U.S. Provisional Patent Application No. 61/886,480 filed Oct. 3, 2013 and entitled "System and Method of Vector-DMA cache-XOR for MPCC Erasure Coding," which is incorporated herein by reference as if reproduced in its entirety.

TECHNICAL FIELD

The present invention relates to a system and method for data storage clusters, and, in particular embodiments, to a system and method of vector-DMA cache-XOR for m-Parities Convolution Codes (MPCC) erasure coding.

BACKGROUND

The use of 3-parity convolution codes for digital tape track error check-correction generally was developed in 1978. 5-parity data erasure recovery by 5 parallel exclusive-or (XOR)-engines generally was developed in 2004.

The 5 parallel independent Random Array of Independent Discs (RAID)-5 kind XOR-engines use a lot of silicon die-area for five dedicated 1 megabyte (MB) first-in first-out (FIFO) buffers and ten Direct Memory Access (DMA)-engines in order to reach better Hard Disk read performances, but the five XOR-engines conflict at the same external memory bus, then they cannot be efficiently utilized. Also, it is not programmable and does not work for more than five erasures. Many RAID5/6 controller chips have four XOR-engines in parallel, but they are idle in most of time waiting for data to be ready by the host central processing units (CPUs), especially in cluster EC usages.

SUMMARY

In an embodiment, a network component for managing data storage includes a storage interface configured to couple to a plurality of storage devices; and a vector-direct memory access (DMA) cache-exclusive OR (XOR) engine coupled to the storage interface and configured for a multiple parities convolution codes (MPCC) erasure coding to accelerate M parities parallel calculations and the erasures cross-iterations decoding, wherein a single XOR-engine with caches and a vector-DMA address generator is shared by the MPCC erasure coding engine for pipelining external dual data rate (DDR4) memory accesses, where M is a positive integer greater than two.

In an embodiment, a method for utilizing programmable vector-direct memory access (DMA) cache-exclusive-or (XOR) engine (VDXe) for convolution erasure coding, includes determining with the VDXe a plurality of parities in a round-robin fashion by reading N fragments from one local buffer and N−1 fragments received from a remote direct access (rDMA) packet scatter around a plurality of buffer pools and pointed to by a plurality of rDMA scatter-gathering (SG) chains, where N is a positive integer usually greater than M; and recovering data loss with the VDXe in a redundant array of independent disk (RAID) storage clusters or geo-distributed sites in the clouds by a zero-copy packet-by-packet exclusive OR (XOR) operation on the received rDMA packets pointed to by the SG chains.

In an embodiment, a method for utilizing programmable vector-direct memory access (DMA) cache-exclusive-or (XOR) hardware for convolution erasure coding includes computing, by the vector DMA cache-XOR hardware, parities for the convolution erasure encoding; computing, by the vector DMA cache-XOR hardware, syndromes for the convolution erasure decoding; and performing, by the vector DMA cache-XOR hardware, cross-syndrome iterations to recover/rebuild erasure lost data, in a unit-by-unit fashion rather than a block-by-block of RAID5/6 XOR-engine and the processing unit is a cache-line of 16 bytes or double cache-line of 32 bytes.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
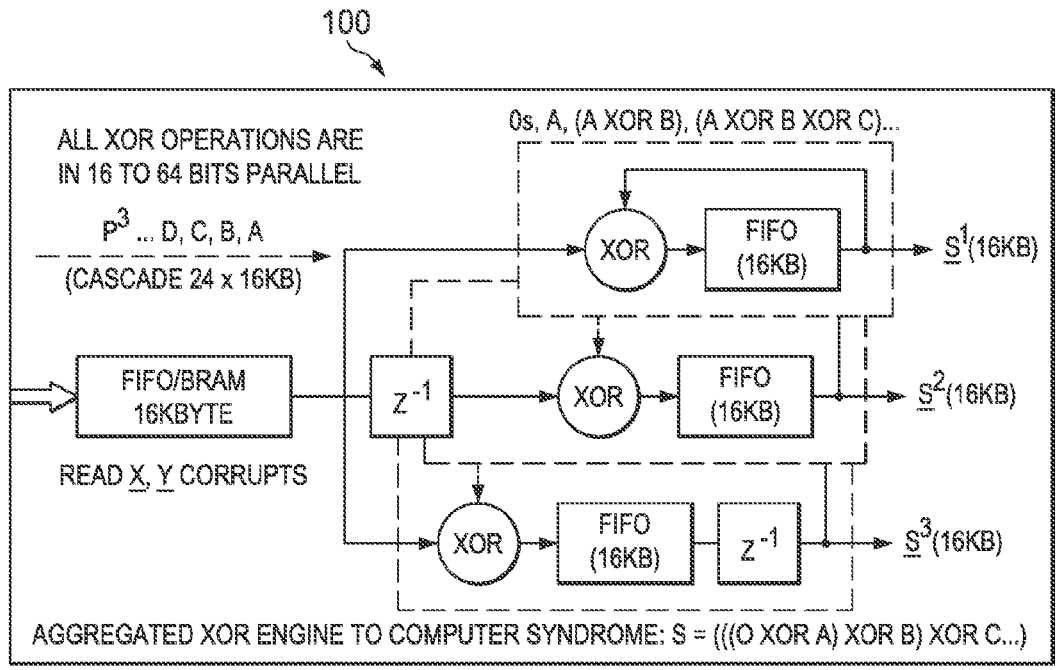
FIG. 1 illustrates a system for three RAID5-XOR engines for 3-parities.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Disclosed herein, in an embodiment, is a Vector-Direct Memory Access (DMA) XOR for MPCC Erasure Coding engine (VDXe) design to accelerate the M parities parallel calculations and M erasures cross-iteration decoding by sharing a single XOR-engine with caches and a Vector-DMA engine for fast computation, pipelining external double data rate (DDR) dynamic random access memory (DRAM) DDR3/DDR4 memory accesses, and low application specific integrated circuit (ASIC) cost.

Disclosed herein has an embodiment network component for managing data storage. The network component includes a storage interface configured to couple to a plurality of storage devices; and a vector-direct memory access (DMA) cache-exclusive OR (XOR) engine coupled to the storage interface and configured for a multiple parities convolution codes (MPCC) erasure coding to accelerate M parities parallel calculations and erasures cross-iterations decoding, wherein a single XOR-engine with caches and a vector-DMA address generator is shared by an MPCC erasure coding engine for pipelining external dual data rate (DDR4) memory accesses, where M is a positive integer greater than two. In an embodiment, the network component includes a processor a level 1 (L1) cache, a level 3 (L3) cache, a zero-copy receiver parsing component, an L1 vector DMA controller, and a packet spread transmitter. In an embodiment, the vector-DMA cache-XOR engine is configured to perform zero-copy packet-by-packet XOR operations to recover data loss in the storage devices. In an embodiment, the vector-DMA cache-XOR engine is configured to write a plurality of data blocks to external dual in-line memory modules (DIMMs) by reading at least some of the storage devices. In an embodiment, the vector-DMA cache-XOR engine is configured to send a plurality of data blocks to other network components by reading the DIMMs. In an embodiment, the vector-DMA cache-XOR engine is configured to receive data packets from other network components and write the data packets to the DIMMS with an remote direct memory access (rDMA)-scatter-gathering (SG) chains. In an embodiment, the network component includes a level 1 (L1) vector-DMA controller and address-generator with a Δ-map that builds all offset addresses with proper cross-correlations among the data, wherein the linear Δ-map supports non-equal length parities. In an embodiment, the network component includes a non-liner Δ-map controlled by firmware that supports equal length parities. In an embodiment, the vector-DMA cache-XOR engine comprises a level 3 (L3)-cache that pre-fetches two data packets in a round-robin fashion from each data block. In an embodiment, the vector-DMA cache-XOR engine includes an XOR Register that reads buffers 1 cache-line at a time and an XOR unit that computes a plurality of parities, writes to L1-cache as 2 times the number of parities times the number of storage device read/write operations. In an embodiment, the vector-DMA cache-XOR engine includes a plurality of XOR units operating in parallel and that writes to L1-cache read/write operations equivalent to the number of XOR units operating in parallel.

Disclosed herein is an embodiment method for utilizing programmable vector-direct memory access (DMA) cache-exclusive-or (XOR) engine (VDXe) for convolution erasure coding. The method includes determining with the VDXe a plurality of parities in a round-robin fashion by reading N fragments from one local buffer and N−1 fragments received from an rDMA packet scatter around a plurality of buffer pools and pointed to by a plurality of rDMA scatter-gathering (SG) chains, where N is a positive integer; and recovering with the VDXe data loss in a redundant array of independent disk (RAID) storage cluster by a zero-copy packet-by-packet exclusive OR (XOR) operation on the received rDMA packets pointed to by the SG chains. In an embodiment, recovering the lost data includes parsing all received rDMA packets pointed to by the SG chains as a zero-copy Rv and XOR computing the received rDMA packets in data fragments in a round-robin fashion. In an embodiment, each of a plurality of nodes writes a plurality of equal sized data blocks to external dual in-line memory modules (DIMMs) by reading the RAID storage cluster. In an embodiment, the method also includes generating offset-addresses to fetch data for a plurality of XOR operations cache-line by cache-line. In an embodiment, the method uses shared caches to perform XOR operations. In an embodiment, the method includes pausing XOR operations of multi-threading tasks in response to a pause or an end command and saving all the shared caches to external memories for future continuation of the XOR operations. In an embodiment, the shared caches include at least two of address-cache, scratch-cache, and input-cache. In an embodiment, a done code causes all read/write threads to close and releases all the shared cache resources. The RAID storage cluster can be geo-distributed site cloud storage clusters. In an embodiment, determining the plurality of parities includes performing a vector DMA for vector memory iterations without a digital processor.

Disclosed herein is an embodiment method for utilizing programmable vector-direct memory access (DMA) cache-exclusive-or (XOR) engine (VDXe) for convolution erasure coding. The method includes computing, by the vector DMA cache-XOR hardware, parities for the convolution erasure coding, computing syndromes for the convolution erasure coding; and performing cross-syndrome iterations to recover erasure lost data. In an embodiment, the method includes pausing the cross-syndrome iterations and saving all cache data into external memories for future continuation of cross-syndrome iterations. In an embodiment, the method includes spreading N−1 of 1 megabyte (MB) remote direct memory access (rDMA) sequential block transfers into 128 interleaved 8 kilobyte (KB) packets scattering among N−1 or more of 1 MB rDMA block transfer threads to stream/emulate concurrent rDMA transfers, whereby a buffer size at rDMA receiver nodes for cache-exclusive-or (XOR) is reduced. In an embodiment, the method also includes a programmable DMA cache-XOR engine (VDXe) that builds a fine-scatter of 128×8 KB rDMA scatter-gathering (SG)-chains effectively as 128 of concurrent rDMA transfers to support the cache-XOR without a need for large buffers.

Cloud storage erasure coding (EC) clusters generally have the following system requirements. For clusters, there are at least N+6 cloud storage nodes (N=24 or more). There are 1 MB/block buffers for better hard disk drive (HDD) access performances. There are 1000 or more concurrent read threads per cluster node. For six erasures, there are six parities to fix six failures of HDDs, cluster nodes, or Data Center Ethernet (DCE) links. For XOR operations, there are six 1 MB accumulative-XOR engines to process N of 1 MB data sequentially, for fewer buffers. For a client to write data into a node, this node XOR computes 6 or M parities from the N data blocks then rDMA writes/distributes them into N+M nodes and calls the metadata server to record new entries of data segments; to read from a node to egress data blocks, this node calls the metadata server to setup all related nodes to egress data packets from each good nodes to the client orderly, x good nodes with M parities blocks are ready for rebuilding failed data blocks caused by either HDDs failures or networking troubles with proper rDMA queue-pairs and VDXe SG-chains where parities nodes are rotated as RAID5 fashion for load-balancing. More external memories could support more threads.

The current RAID5 XOR-engine is by accumulative-XOR with a fixed-size FIFO (64 KB) plus DMA-read and DMA-write engines. The intermediate XOR result block is held in the FIFO, then XOR-computed with input data blocks (64 KB), one-by-one, accumulatively. Then, five such XOR-engines in parallel can compute five parities for encoding, plus a complicated DSP iterative decoder for five erasure recoveries. It introduces a lot of data movements from small FIFOs to/from external memories to support the N of 1 MB sequential cluster data blocks from N−1 different cluster nodes.

Figure 2:
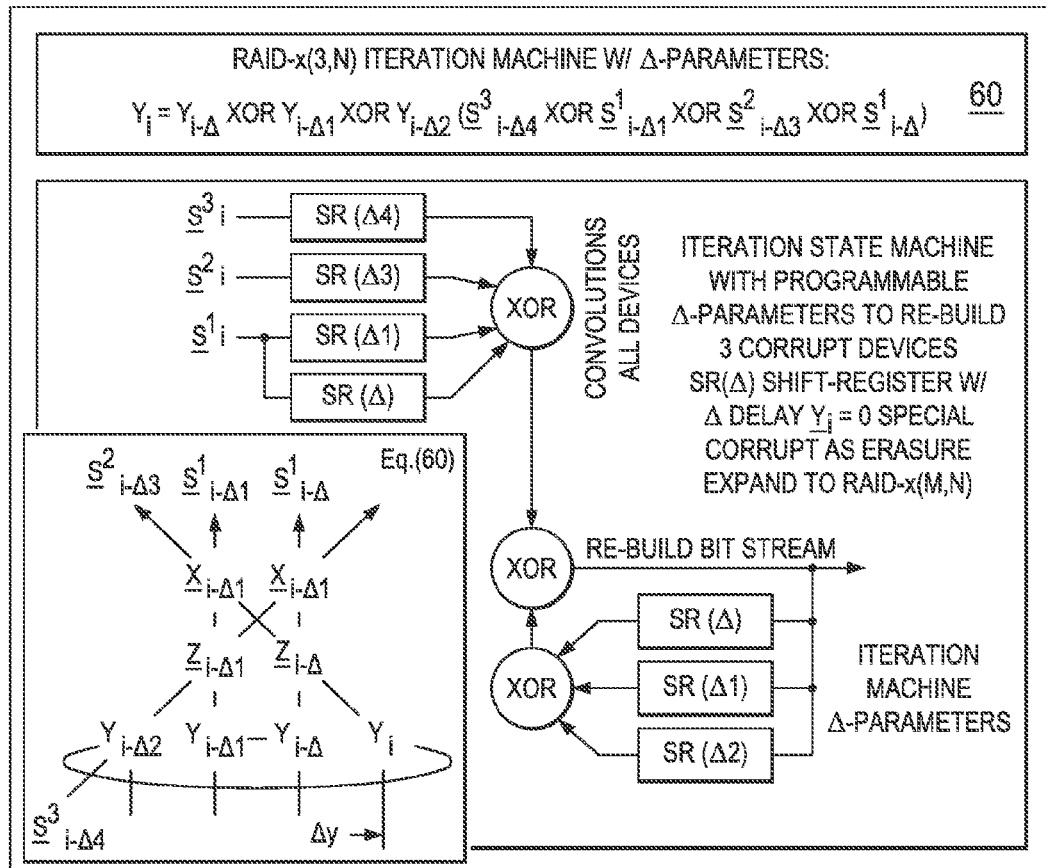
FIG. 2 illustrates a system for DSP decoding of convolution erasure codes to iterate 3-erasures.
Figure 3:
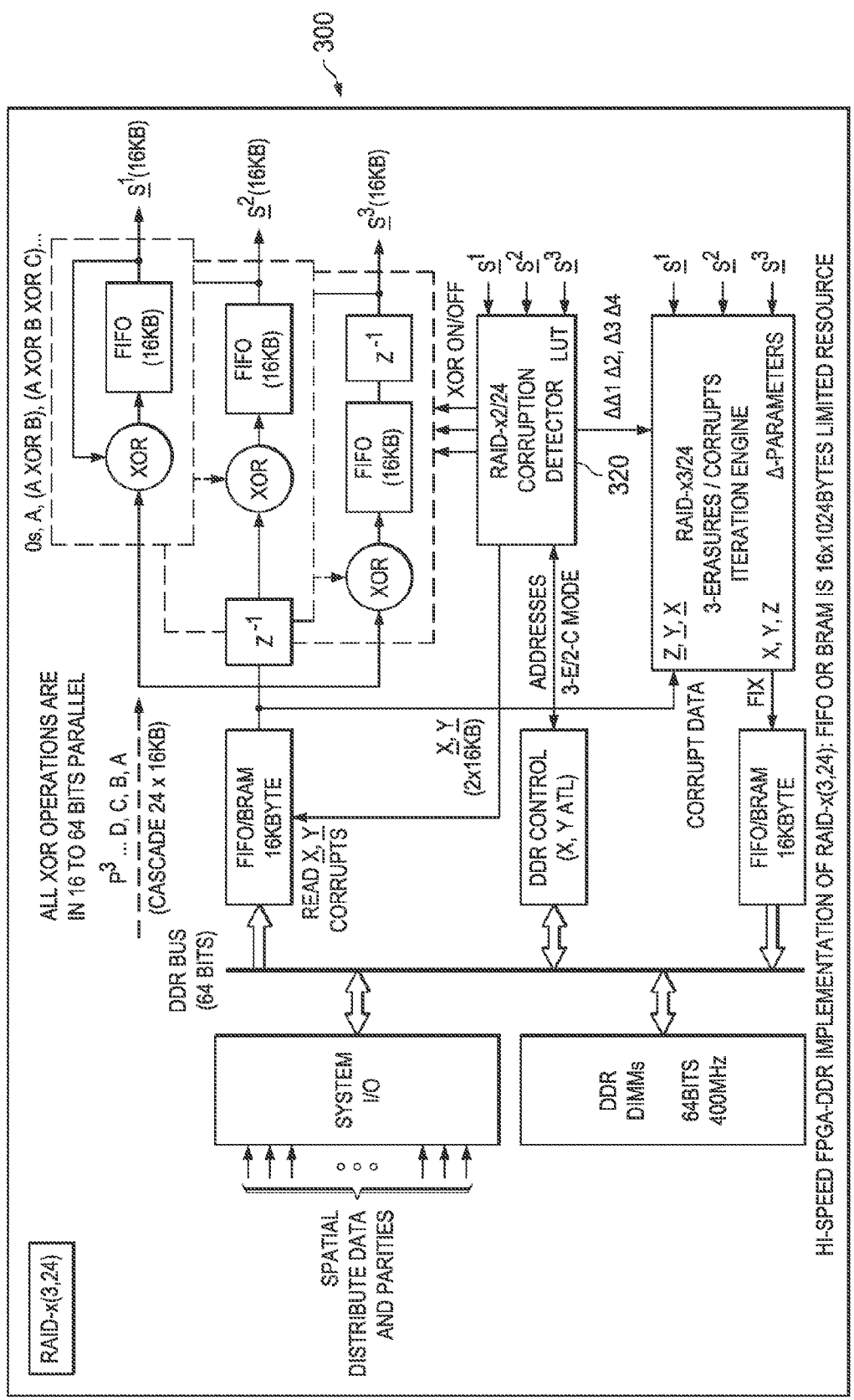
FIG. 3 illustrates a system for three RAID5-XOR engines and DSP decoding of convolution erasure codes.
Figure 4:
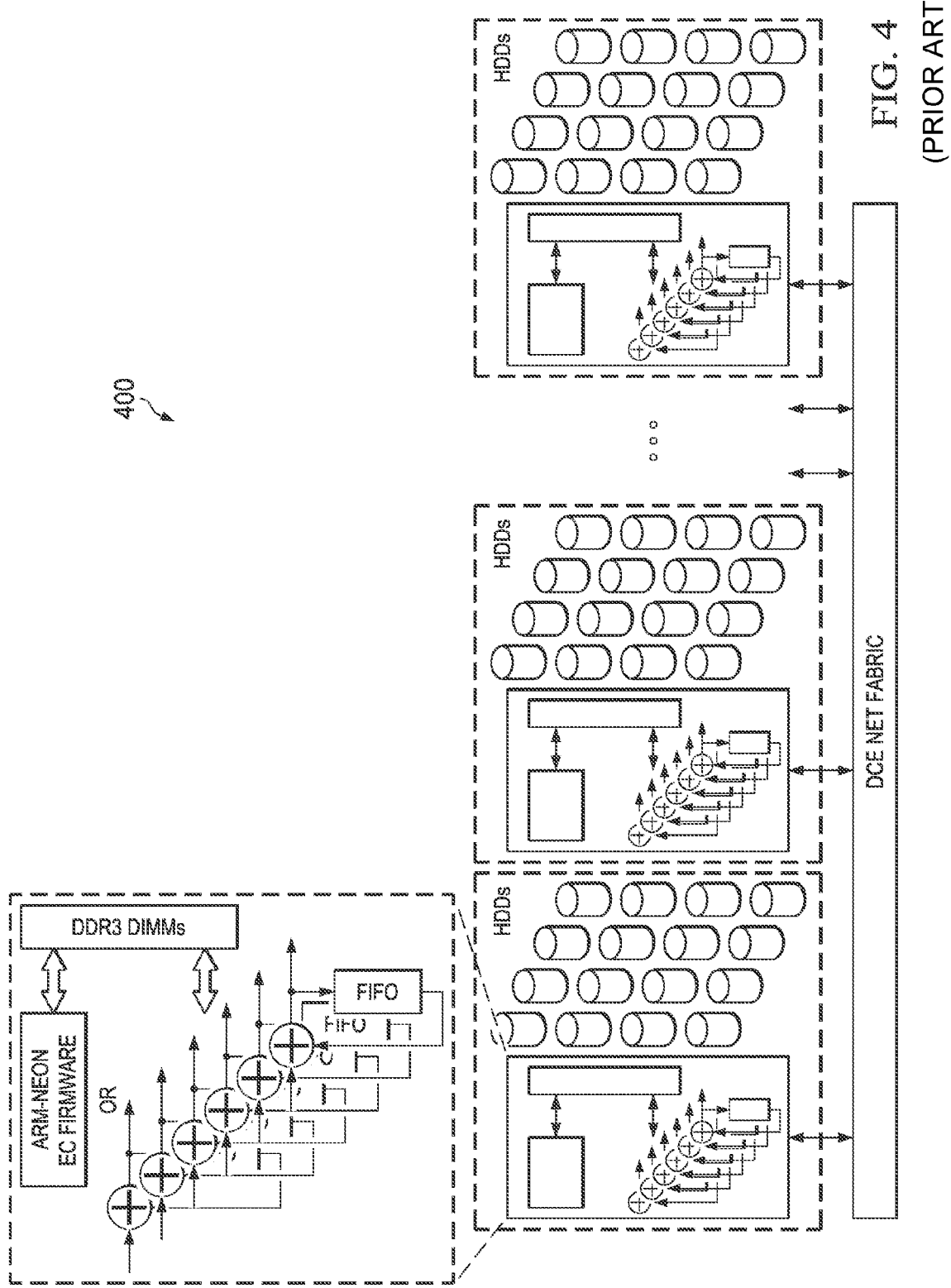
FIG. 4 illustrates a system for six XOR-engines or NEON core with external dual in-line memory modules (DIMMs) with rDMA ops through Data Center Ethernet (DCE) fabric, which has a performance penalty.

FIG. 1 illustrates a system 100 for three RAID5-XOR engines for 3-parities. FIG. 2 illustrates a system 200 for DSP decoding of convolution erasure codes to iterate 3-erasures. FIG. 3 illustrates a system 300 for three RAID5-XOR engines and Digital Signal Processing (DSP) decoding of convolution erasure codes. FIG. 4 illustrates a system 400 for six XOR-engines or NEON core of 128 bit single instruction multiple data (SIMD) co-processor with external dual in-line memory modules (DIMMs) at each storage cluster nodes, which has a performance penalty.

There are various issues with the above approaches. FIFO based XOR engines cannot support 1000 threads of N sequential 1 MB data blocks by remote direct memory access (rDMA) transfers cross N cluster nodes then XOR operations (ops) among those data. The accumulated-XOR causes a big performance penalty with external DIMMs to emulate 1 MB FIFOs. To fix six of 1 MB erasure blocks, there are two kind external DIMMs accesses, to prepare 24 of 1 MB data, and to accumulative-XOR 6 of 1 MB as follows:

(a) 24 (block) write (wr) from HDDs to DIMMs, 23 read (rd) and 23 write by NIC Tx/Rv to and from other 23 nodes, 2×23 local-DMA to parse randomly arrived packets into 23×1 MBs in DIMMs.

(b) 24 (block)×2 (rd/wr)×6 (parities)=288 times external DIMMs reads/writes per 6 of 1 MB EC rebuilds, plus 24+4×23=116 times reads/writes by (a) ops.

(c) 8 GB/sec external DIMMs can only support 8 GBps/(288+116), about 10 MBps EC performance, if only 50% of the external DIMMs bandwidth is allocated for EC rebuilding usages.

(d) Meanwhile, most of 6 XOR-engines hardware are in idle to wait for external DIMMs bus. An ARM-NEON firmware solution puts the CPU core in idle to support single-instruction multiple-data (SIMD) XOR vector operations. The hardware capacity is wasted in both of current methods as waiting external DIMMs for data.

A vector-direct memory access (vector-DMA) with bus caching mechanism has been used in high-performance multi-core digital signal processors (DSPs). A vector DSP may use a vector-DMA cache scheme between the external memory bus and the vector memory.

An embodiment provides a vector-DMA cache-XOR for a multiple parities convolution codes (MPCC) erasure coding engine to accelerate the M parities parallel calculations and the M erasures cross-iterations decoding by sharing a single XOR-engine with caches and a vector-DMA address generator for low cost, fast computation, pipelining external dual data rate (DDR4) memory accesses.

An embodiment vector-DMA cache-XOR engine includes a single DMA and XOR module plus address-cache, scratch-cache, input caches for efficient burst-accessing the external DDR4 memories, or packet-by-packet, in-storage clusters. An embodiment has three operation modes to compute the M parities, M checksums, and M erasure iterations/recovery.

Figure 5:
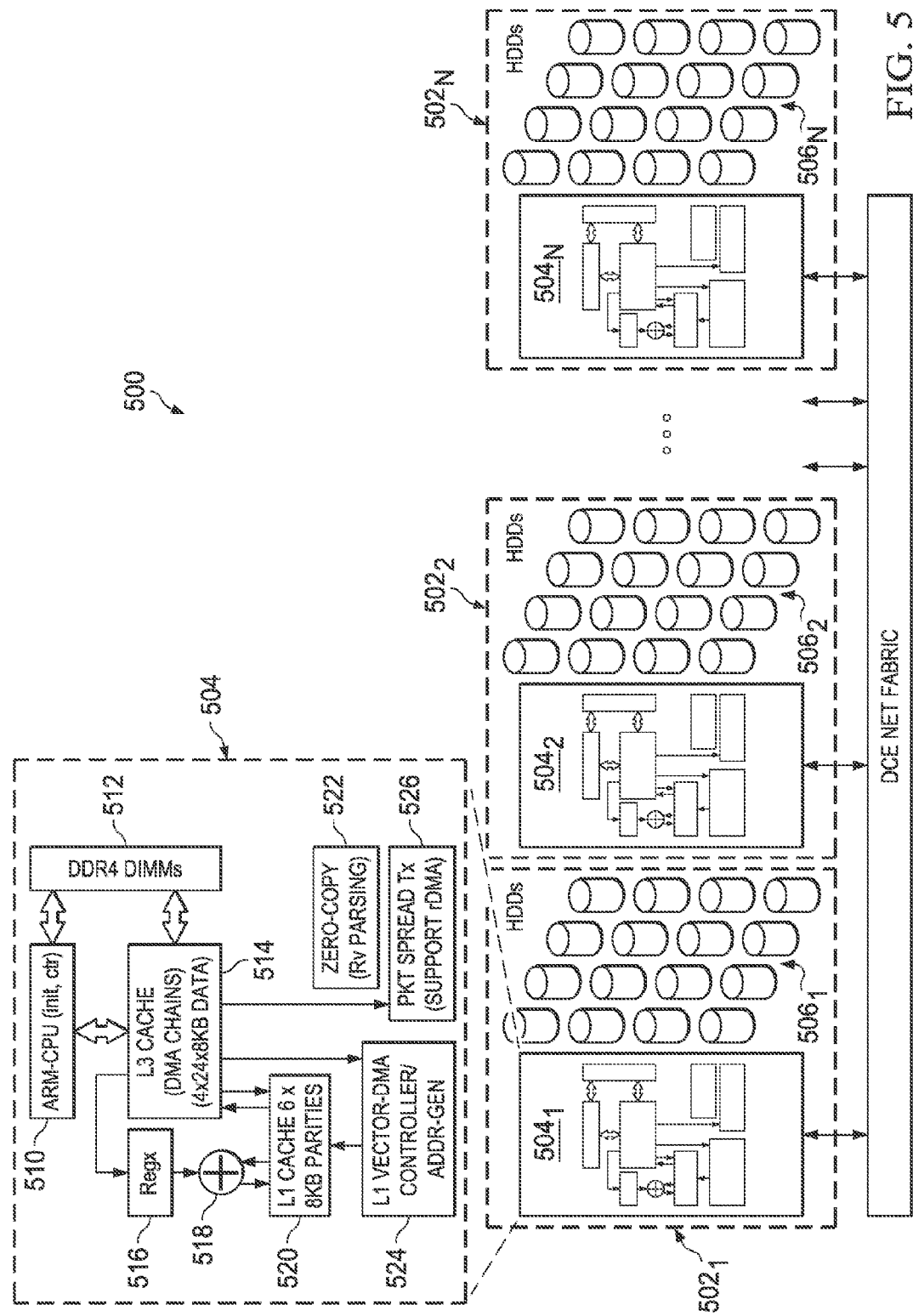
FIG. 5 illustrates an embodiment system for vector-DMA cache-XOR with spread rDMA fragment Tx and zero-copy Rv.

FIG. 5 illustrates an embodiment system 500 for vector-DMA cache-XOR with spread rDMA fragment Tx and zero-copy Rv. The system 500 includes a plurality of DCE net fabric components 502. Each DCE net fabric component includes a vector-DMA cache-XOR engine 504 and a plurality of hard disk drives 506. Each vector-DMA cache-XOR engine 504 includes the following hardware resources: an ARM-CPU 510 (e.g., in an embodiment, a CPU with a reduced instruction set computing (RISC) architecture), a shared XOR computing component 518, a 256 bit XOR data register 516; a L1-cache XOR 520 with 64 KB (parity fragments); an L1 vector DMA controller, address (addr)-generator 524; an L3-cache 514 to support four XOR threads; a zero-copy Rv 522 to parse random arrived rDMA pkts from other clusters; a packet spreading Tx 526 to scatter out rDMA packets (pkts) to other clusters; and a DDR4 external DIMMs 512 with 2 GB to support 1000 threads, where each node double buffers 1000 of 2×1 MB data blocks at local node and the VDXe processes N of 8 KB packets in burst fashion up to total N+M of 1000 threads or read/write ops. There are no needs for whole disks rebuilding maintenance ops but only rebuilding the failed blocks as reading few faulty HDDs or network troubles, in rush hours. Actually, 1 GB buffers are enough to support 1000 output threads, N/(N+M) of 1 GB for rDMA source buffers to support M nodes rebuilding failed blocks, and M/(N+M) of 1 GB for rDMA destination buffers to rebuild failed data blocks at this node.

In an embodiment, basic functions of the vector-DMA cache-XOR engine 504 include the following.

vector-DMA: L1-cache vector-DMA control and address generators to support two concurrent 24 XOR in 8 KB fragments by rDMA-scatter-gathering (SG) chains.

cache-XOR: L1-cache for 6×8 KB parities, 24 reads and 6 writes to external DIMMs. L3-cache for two 24×8 KB data packets with rDMA-SG chains.

zero-copy Rv: to parse all received rDMA pkts pointed by SG chains from 23 nodes as zero-copy Rv, then to XOR them in 8 KB fragments, round-robin fashion such that XOR workflow replaced old local DMA parsing randomly arrived 8 KB packets into 23 of 1 MB buffers ops.

Packet spreading Tx 526 scatters twenty-three of the 1 MB sequential rDMA packet streams 1 MB-by-1 MB ops into 128 of 8 KB packets interleaved from twenty-three of 1 MB buffers in round-robin fashion to minimize buffer requirements at rDMA receiver nodes in order to make cache-XOR possible with much less external memory accesses. It is also possible to synchronize rDMA Tx SG-chains with the same source/destination addresses among 128 properly spread 8 KB packets, thread-by-thread.

Cluster XOR Ops:

(a) each node writes 1000 of 1 MB to its external DIMMs by reading related HDDs and most of those data packets are delivered to clients directly.

(b) it rDMA writes x/(N+M) of 1000 data blocks to other x nodes holding good parity blocks by reading DIMMs as 8 KB per packet, where x is less or equal M of faulty nodes.

(c) it may also receives rDMA pkts from other 23 nodes then writes them to DIMMs with properly built rDMA-SG chains if it holds related good parity blocks.

(d) as long as one set 24×1 MB data is ready, vector-DMA can be initialized then fired-up to compute M parities; or one set 24×8 KB packets/segments to compute syndromes then to iterate/rebuild failed data unit-by-unit.

(e) L1 vector-DMA controller and address-generator with Δ-map builds all offset addresses with proper cross-correlations among 24 data. A linear Δ-map will support non-equal length parities, and special non-liner Δ-map controlled by firmware can support equal length parities to eliminate the drawbacks in the pre-arts.

(f) L3-cache pre-fetches two 24×8 KB data packets, round-robin from each 1 MB data.

(g) XOR Regx reads/buffers 1 cache-line, XOR unit computes six parities, writes to L1-cache as 2×6×24 rd/wr ops; it reduces to only six wr ops by 6-XOR units in parallel.

(h) repeat (g) round-robin 24 of 8 KB data fragments, then write 6 parities to DIMMs.

A current DMA-XOR controller has N source address registers (pointers (ptrs)), to sequentially read 1 MB data, one-by-one from N ptrs to accumulate one of 1 MB parity. It also has one length register, one count register to generate the offset address that is shared by all N addresses, and it has one destination address, to write the final accumulated parity in the FIFO to external DIMMs.

Figure 6:
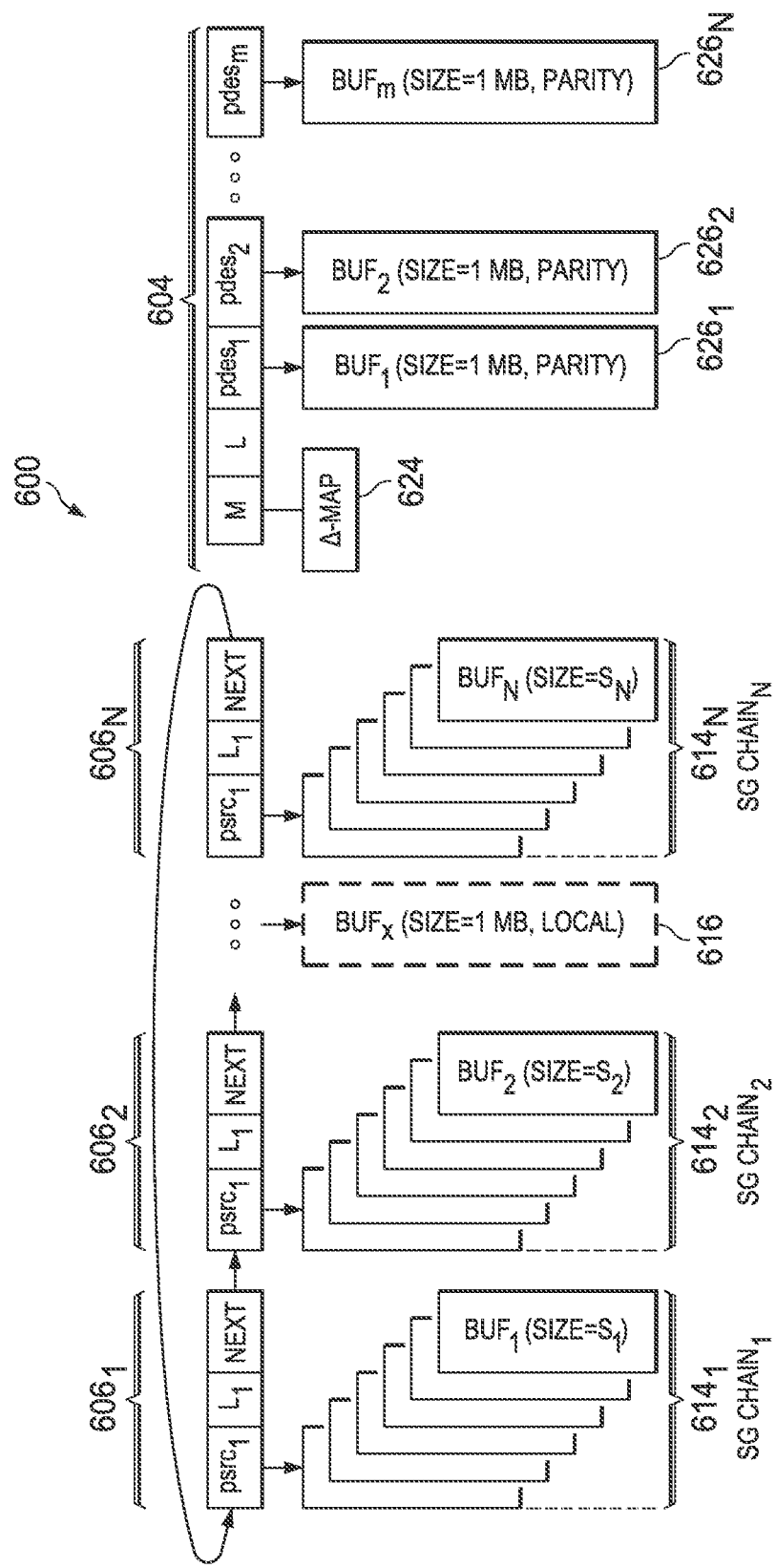
FIG. 6 illustrates an embodiment system of a vector-DMA Cache-XOR in parity mode for encoding.

FIG. 6 illustrates an embodiment system 600 of a vector-DMA Cache-XOR in parity mode. System 600 includes a plurality of data fragments 606. The vector-DMA controller (parity XOR) includes the following:

(a) one XOR engine computes 6 parities, in round-robin by reading N of 8 KB fragments 606 from one local 1 MB buffer, and N−1 fragments that are received rDMA packets scattered around all buffer pools and pointed by 23 rDMA scatter-gathering chains 614.

(b) L1-cache vector-DMA controller and address-generator will hold following data structures of data source ptrs and destination parity ptrs, then dynamically generate all offset-addresses with Δ-map 624 to fetch 8 KB data 604 for six parity XOR ops, cache-line by cache-line. One data unit is XOR by six parity units with proper cross-correlation offsets from different 8 KB partial parity fragments.

(c) L=1 MB for output parity buffers 626, $L_1$ to $L_N$ are aggregated from each SG chain with fragment size $S_k$ in 8 KB increment (only one 1 MB $buf_x$ is for local data).

(d) L3 data cache supports one data read and L1 XOR cache will handle six reads and six writes for six parity XOR ops.

(e) L3 data cache could pre-fetch at least two 24×8 KB data fragments to support six concurrent parity XOR ops.

In this parity XOR mode, M parities are computed sequentially unit-by-unit (256 bit/unit upon memory bus and cache-line) from N data inputs 606 as shown in FIG. 6. Each of N inputs is loaded into data caches 614 in 1 KB~9 KB programmable packets associated with a DMA descriptor chain that includes M parities' destination addresses and size of burst-write to external memories, the sequence of input data packets' source address with burst-read size and time-spacing among parities. The data packet size is up on the Data-Center-Ethernet (DCE) switch fabric as 1.5 KB, 8 KB, or 9 KB.

Figure 7:
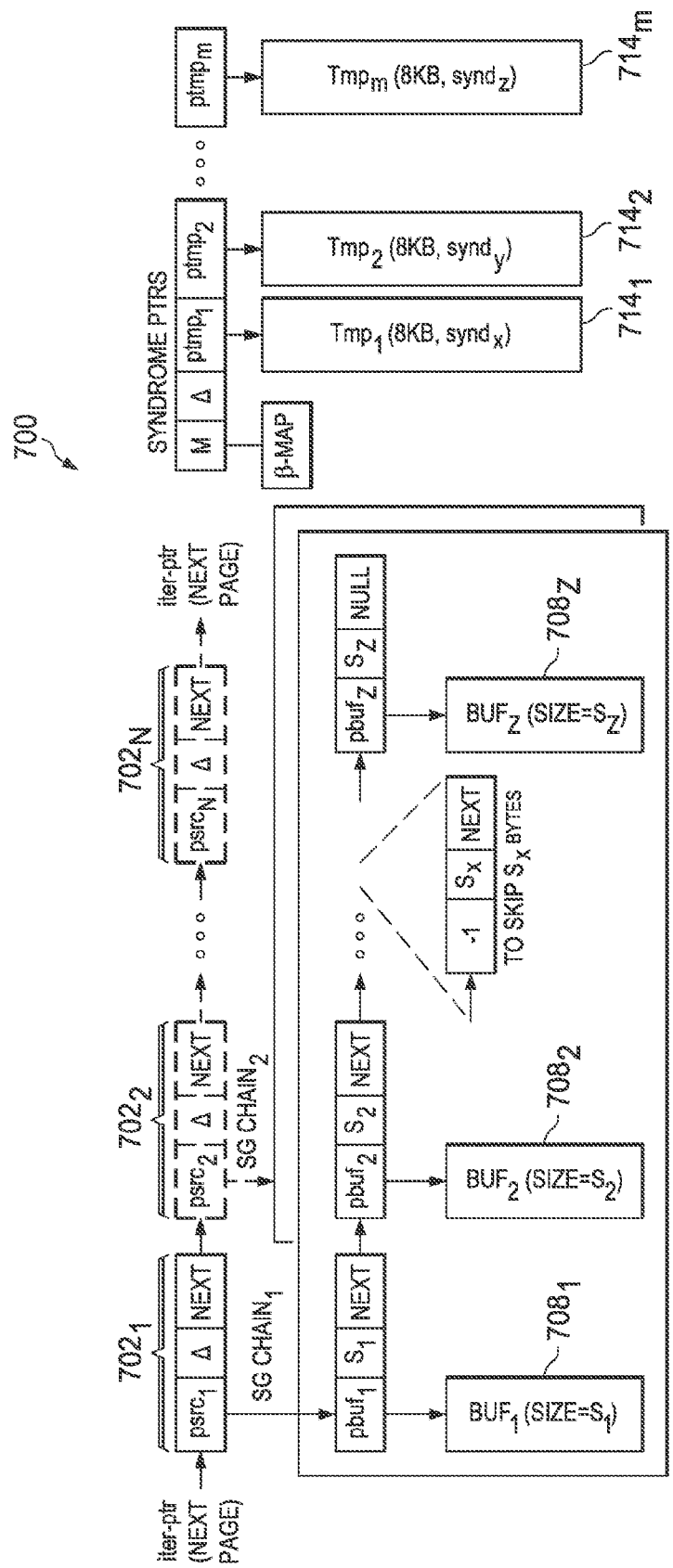
FIG. 7 illustrates an embodiment vector-DMA Cache-XOR in syndrome mode for decoding.

FIG. 7 illustrates an embodiment vector-DMA Cache-XOR 700 in syndrome mode with source SG-chains point to the data in external DDR4 memory buffers and destinations point to the syndromes in L1-cache. The vector-DMA controller is an N+m EC decoder that includes syndrome XOR and cross-iteration XOR steps, as 8 KB-by-8 KB fragment cache-XOR ops.

(a) L1-cache vector-DMA address-generator will hold data structures of data source ptrs and syndrome ptrs; 6 syndrome ptrs point to 6×8 KB temporary (tmp) circular buffers 708; after every 6 of 8 KB syndromes done, cross-iteration is called.

(b) L3 data cache fetches 24×8 KB data fragments 702, there may be 1-6 data erasures with 1~6 parities, even piecewise erasures, such that a $pbuf_x=-1$ set to skip $S_x$ erasure bytes, and next=null marked for end of SG chain; where Δ=8 KB, $\Sigma S_j=L_t$ marked for syndrome mode.

(c) Firmware sets up all addresses, zeros tmp buffers 714, loads initial values, then starts 24×8 KB cache-XOR ops in the following fashion.

(d) syndrome-XOR→iteration-XOR→write 6×8 KB rebuilt data fragments to external DIMMs→update all addresses; repeat step (d) until reach end of SG where all vector-DMA data fetch and cache-XOR ops are the same as in parity-XOR mode. However, parity-XOR DMA descriptors are circular chains up to 24×1 MB data, decoder DMA descriptors are interleaved for syndrome-XOR then iteration-XOR ops.

In this syndrome-XOR mode, x checksums or syndromes are computed sequentially from N−x data inputs where x indicates the missing data inputs, as shown in FIG. 7. The DMA descriptor chains include x cache addresses pointing to scratch-cache area with a mapping vector to mask out the missing parities, the sequence of input data packets' source addresses with burst-read size and time-spacing among parities. The x will be equal to 1 in most cases, and x=6 for worst case of rebuilding six erasure failures.

Figure 8:
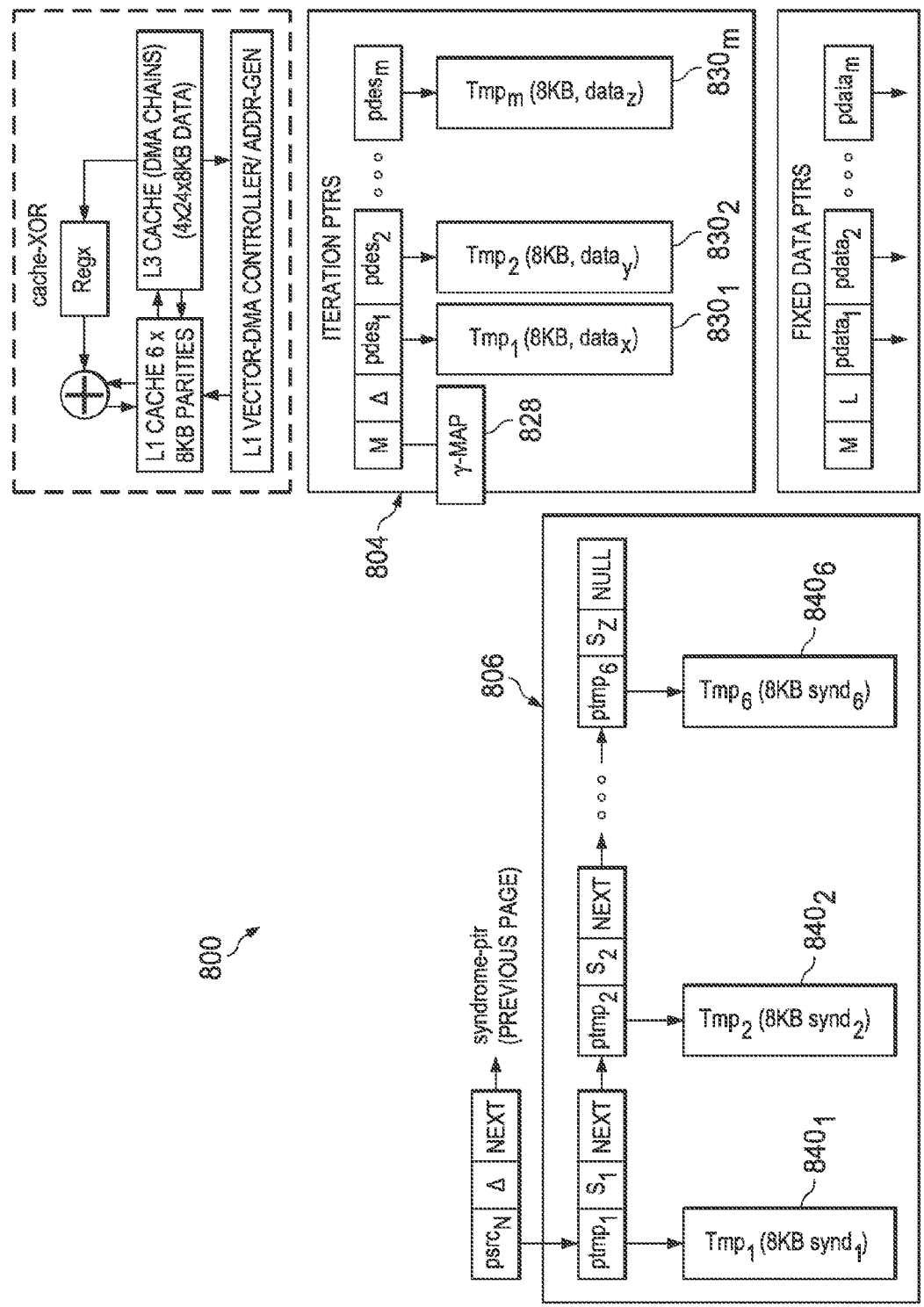
FIG. 8 illustrates an embodiment vector-DMA cache-XOR in iteration mode for rebuilding data loss from syndromes.

FIG. 8 illustrates an embodiment vector-DMA cache-XOR 800 in iteration mode with both of source and destinations SG-chains point to the syndromes in L1-cache and SG-chains of final fixed data buffers in external DDR4 memories. The vector-DMA controller 800 (iteration XOR) includes the following.

(a) L1-cache 806 already holds 6×8 KB syndrome fragments as $Tmp_1 \sim Tmp_6$ buffers 840, DMA source blocks 838.

(b) XOR Regx fetches one cache-line from L1-cache (by shortcut or thru L3).

(c) one difference from the previous two modes is the XOR source and destination partners to the same 6×8 KB scratch buffers 830 with proper iteration partners to previous iteration results setup by firmware or application programming interfaces (APIs) as β-map 828 cross-correlations among N−x good data and x parities by the XOR initialization process.

(d) after one round of syndrome-XOR and iteration-XOR ops, the vector-DMA controller copies the 6×8 KB fragments of rebuilt data to the final 6×1 MB data buffers in external DIMMs.

(e) this hardware design uses all 1 MB buffers from common buffer-pools shared by HDD reads/writes, rDMA Tx/Rv buffer-rings, and vector-DMA cache-XOR engine.

In this erasure iteration mode, the x syndromes generated by syndrome-XOR can be further iterated unit-by-unit with γ-map 828 cross-correlations among syndromes as shown in FIG. 8. The DMA descriptor chains include x recovered erasures' destination addresses and size of burst-write to external memories followed by x+1 iteration-spacing values then sequence of checksum descriptor chains. The VDXe reads x−1 syndromes to XOR iterate out 1 recovered erasure unit, erasure-by-erasure, where each erasure unit is cache-line.

Various embodiments provide one or more of the following features:

(1) The number M is programmable as 3, 4, 5, 6, 7, 8 or higher.

(2) The shared caches are address-cache, scratch-cache, input caches for efficient burst-accessing external DDR4 memories.

(3) Support for zero-copy packet-by-packet XOR operations to recover the storage clusters and cloud storage erasures.

(4) Support packet spreading Tx for rDMA to scatter out pkts to other N−1 storage clusters or cloud nodes to emulate 128 or 256 concurrent big rDMA transfers and effectively reduce the buffer size in receiver ends.

(5). There are 3 cross-correlation tables, Δ-map for M parities, β-map for M syndromes, and γ-map for M iteration rebuilt data. The simple linear cross-correlation maps are for non-equal-length parities, and non-linear maps can support equal-length parities.

(6) Programmable to support MPCC-EC XOR computations for storage cluster or cloud data recovery.

(7) VDXe's descriptor chain can be ended by a pause code or a done code to support multi-tasking operations. In the pause case, the hardware saves all related VDXe control registers and locks to the related partial parity memories in external DDR4 for future continuing computations. In the done case, VDXe will close all the read/write threads and release all related resources.

An embodiment utilizes a vector-DMA XOR for convolution erasure coding. An embodiment provides fast computation performances with cache management. An embodiment provides lower cost with less die-size. An embodiment utilizes hardware accelerating the M-parities, M-checksums, M-iterations parallel computations for MPCC convolution erasure coding. An embodiment provides a single vector-DMA XOR engine with programmable N+M, for N data streams/sources and redundant M parities/checksums. Embodiments may be implemented in storage clusters, data centers, solid state disk (SSD)/HDD erasure controllers, virtual storage appliances, cloud storages, disaster recovery storage solutions, and the like.

Figure 9:
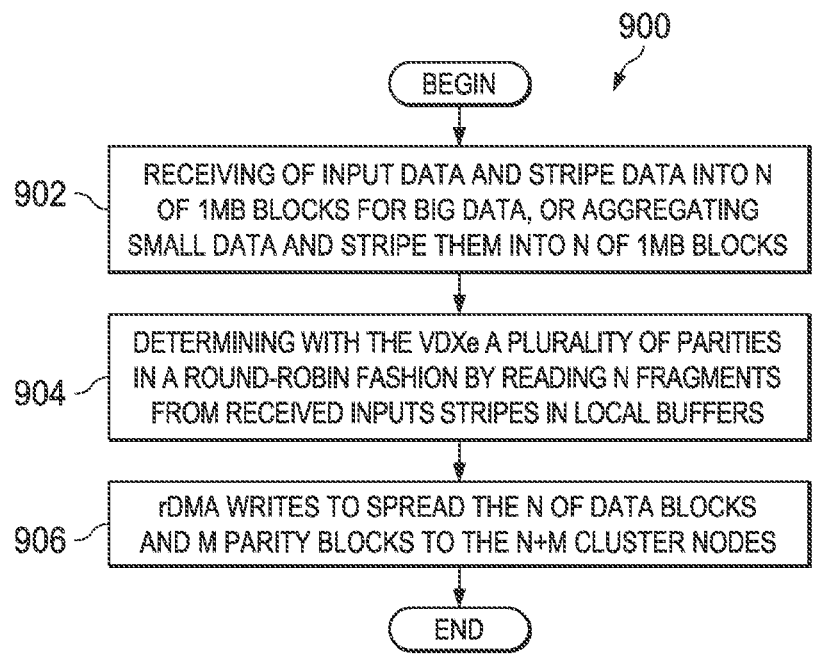
FIG. 9 is a flowchart of an embodiment method for utilizing programmable vector-direct memory access (DMA) cache-exclusive-or (XOR) engine (VDXe) for convolution erasure code encoding to compute M parities.

FIG. 9 is a flowchart of an embodiment method 900 for utilizing programmable vector-direct memory access (DMA) cache-exclusive-or (XOR) engine (VDXe) for convolution erasure code encoding to generate M parities. The method 900 begins at block 902 where each node inputs data to stripe them into N of 1 MB for big data stripe, or aggregates small data to stripe them for parities; following block 904 where the VDXe determines a plurality of parities in a round-robin fashion by reading N fragments from the stripe in the local buffers, where N is a positive integer. At block 906, the VDXe distributes the N data and M parities into N+M cluster nodes by rDMA write transfers, after which, the method 900 ends.

Figure 10:
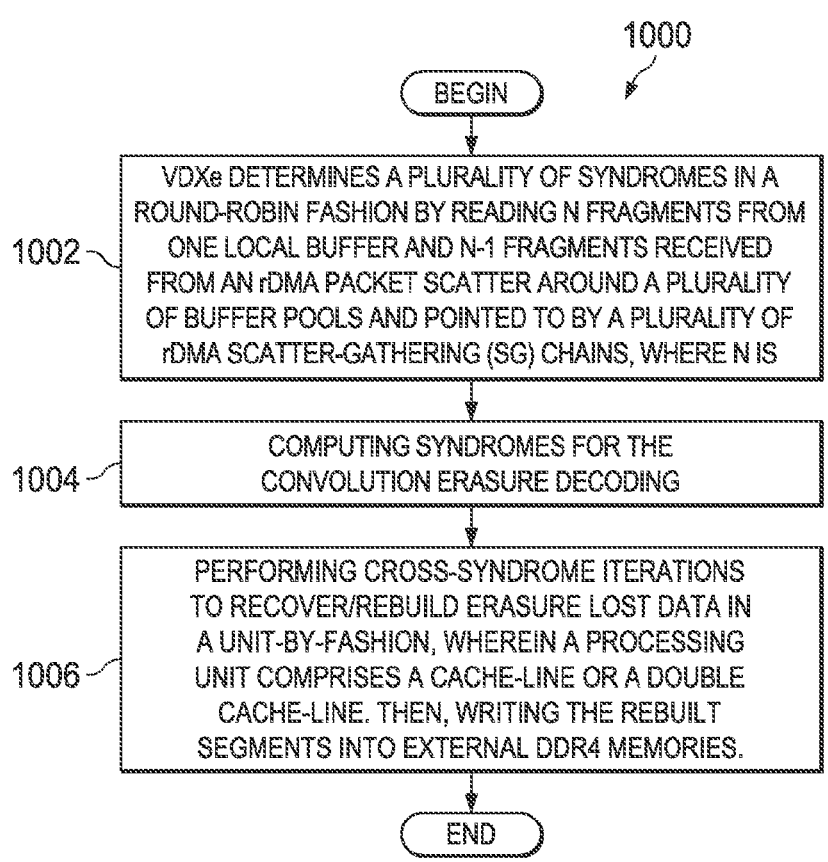
FIG. 10 is a flowchart of an embodiment method for utilizing programmable vector-direct memory access (DMA) cache-exclusive-or (XOR) hardware for convolution erasure code decoding to rebuild x failed data segment.

FIG. 10 is a flowchart of an embodiment method 1000 for utilizing programmable vector-direct memory access (DMA) cache-exclusive-or (XOR) hardware for convolution erasure code decoding to compute x syndromes then to iterate/rebuild failed data segments where x is less or equal M failed data. The method 1000 begins at block 1002 where the VDXe determines a plurality of syndromes in a round-robin fashion by reading N fragments from one local buffer and N−1 fragments received from an rDMA packet scatter around a plurality of buffer pools and pointed to by a plurality of rDMA scatter-gathering (SG) chains, where N is a positive integer. At block 1004, the vector-DMA XOR hardware computes syndromes for the convolution erasure decoding from partial data and proper original parities. At block 1006, the vector-DMA XOR performs cross-syndrome iterations to recover/rebuild erasure lost data in a unit-by-unit fashion, wherein a processing unit comprises a cache line or a double cache-line, then writes the rebuilt segments into external DDR4 memories, after which, the method 1000 ends.

Figure 11:
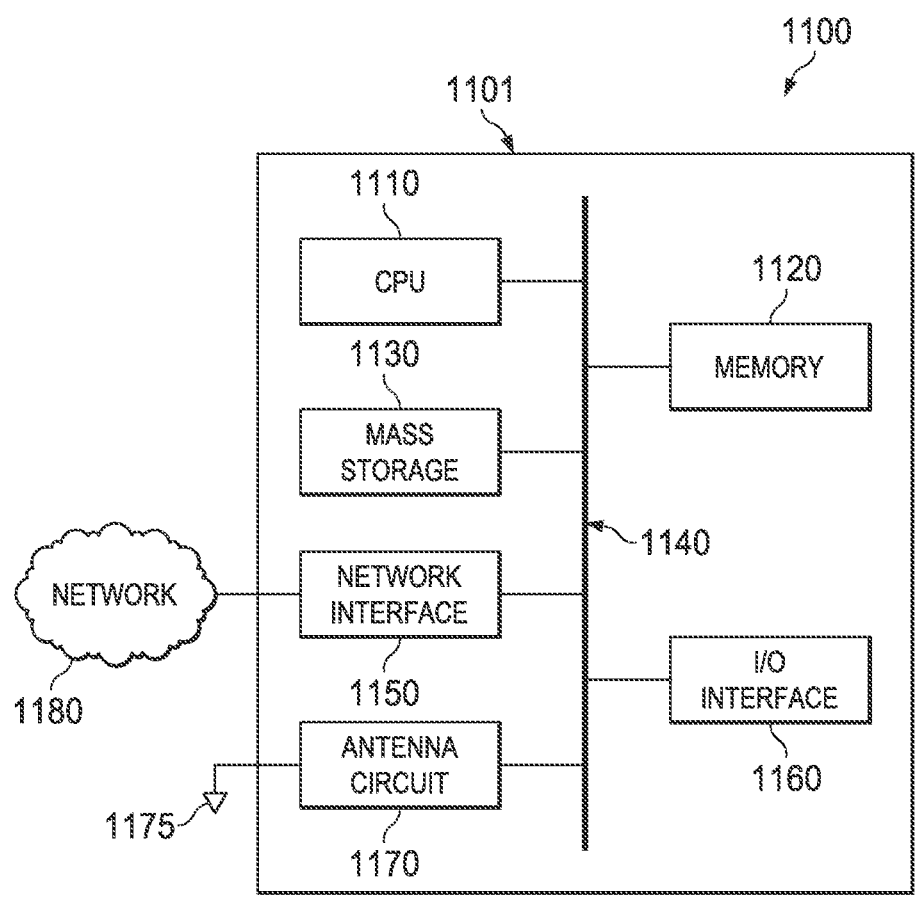
FIG. 11 is a block diagram of a processing system that may be used for implementing the devices and methods disclosed herein.

FIG. 11 is a block diagram of a processing system 1100 that may be used for implementing the devices and methods disclosed herein. Specific devices may utilize all of the components shown, or only a subset of the components and levels of integration may vary from device to device. Furthermore, a device may contain multiple instances of a component, such as multiple processing units, processors, memories, transmitters, receivers, etc. The processing system 1100 may comprise a processing unit 1101 equipped with one or more input/output devices, such as a speaker, microphone, mouse, touchscreen, keypad, keyboard, printer, display, and the like. The processing unit 1101 may include a central processing unit (CPU) 1110, memory 1120, a mass storage device 1130, a network interface 1150, an I/O interface 1160, and an antenna circuit 1170 connected to a bus 1140. The processing unit 1101 also includes an antenna element 1175 connected to the antenna circuit.

The bus 1140 may be one or more of any type of several bus architectures including a memory bus or memory controller, a peripheral bus, video bus, or the like. The CPU 1110 may comprise any type of electronic data processor. The memory 1120 may comprise any type of system memory such as static random access memory (SRAM), dynamic random access memory (DRAM), synchronous DRAM (SDRAM), read-only memory (ROM), a combination thereof, or the like. In an embodiment, the memory 1120 may include ROM for use at boot-up, and DRAM for program and data storage for use while executing programs.

The mass storage device 1130 may comprise any type of storage device configured to store data, programs, and other information and to make the data, programs, and other information accessible via the bus 1140. The mass storage device 1130 may comprise, for example, one or more of a solid state drive, hard disk drive, a magnetic disk drive, an optical disk drive, or the like.

The I/O interface 1160 may provide interfaces to couple external input and output devices to the processing unit 1101. The I/O interface 1160 may include a video adapter. Examples of input and output devices may include a display coupled to the video adapter and a mouse/keyboard/printer coupled to the I/O interface. Other devices may be coupled to the processing unit 1101 and additional or fewer interface cards may be utilized. For example, a serial interface such as Universal Serial Bus (USB) (not shown) may be used to provide an interface for a printer.

The antenna circuit 1170 and antenna element 1175 may allow the processing unit 1101 to communicate with remote units via a network. In an embodiment, the antenna circuit 1170 and antenna element 1175 provide access to a wireless wide area network (WAN) and/or to a cellular network, such as Long Term Evolution (LTE), Code Division Multiple Access (CDMA), Wideband CDMA (WCDMA), and Global System for Mobile Communications (GSM) networks. In some embodiments, the antenna circuit 1170 and antenna element 1175 may also provide Bluetooth and/or WiFi connection to other devices.

The processing unit 1101 may also include one or more network interfaces 1150, which may comprise wired links, such as an Ethernet cable or the like, and/or wireless links to access nodes or different networks. The network interface 1101 allows the processing unit 1101 to communicate with remote units via the networks 1180. For example, the network interface 1150 may provide wireless communication via one or more transmitters/transmit antennas and one or more receivers/receive antennas. In an embodiment, the processing unit 1101 is coupled to a local-area network or a wide-area network for data processing and communications with remote devices, such as other processing units, the Internet, remote storage facilities, or the like.

The following references are related to subject matter of the present application. Each of these references is incorporated herein by reference in its entirety:

Patel et al., U.S. Pat. No. 4,205,324, issued May 27, 1980.
Lee et al., U.S. Pat. No. 7,716,566, issued May 11, 2010.
Lee et al., U.S. Pat. No. 7,882,425, issued Feb. 1, 2011.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A network component for managing data storage, comprising:
   a storage interface configured to couple to a plurality of storage devices; and
   a vector-direct memory access (DMA) cache-exclusive OR (XOR) engine coupled to the storage interface and configured for a multiple parities convolution codes (MPCC) erasure coding to accelerate M parities parallel calculations and erasures cross-iterations decoding, wherein a single XOR-engine with caches and a vector-DMA address generator is shared by an MPCC erasure coding engine for pipelining memory accesses, where M is a positive integer greater than two.

2. The network component of claim 1, wherein the vector-DMA cache-XOR engine comprises a processor a level 1 (L1) cache, a level 3 (L3) cache, a zero-copy receiver parsing component, an L1 vector DMA controller, and a packet spread transmitter.

3. The network component of claim 1, wherein the vector-DMA cache-XOR engine is configured to perform zero-copy packet-by-packet XOR operations to recover data loss in the storage devices.

4. The network component of claim 1, wherein the vector-DMA cache-XOR engine is configured to write a plurality of data blocks to external dual in-line memory modules (DIMMs) by reading at least some of the storage devices.

5. The network component of claim 1, wherein the vector-DMA cache-XOR engine is configured to send a plurality of data blocks to other network components by reading the DIMMs.

6. The network component of claim 4, wherein the vector-DMA cache-XOR engine is configured to receive data packets from other network components and write the data packets to the DIMMS with an remote direct memory access (rDMA)-scatter-gathering (SG) chains.

7. The network component of claim 4, further comprising a level 1 (L1) vector-DMA controller and address-generator with a linear Δ-map that builds all offset addresses with proper cross-correlations among data.

8. The network component of claim 7, wherein the linear Δ-map supports non-equal length parities, and further comprising a non-linear Δ-map controlled by firmware that supports equal length parities.

9. The network component of claim 4, wherein the vector-DMA cache-XOR engine comprises a level 3 (L3)-cache that pre-fetches two data packets in a round-robin fashion from each data block.

10. The network component of claim 4, wherein the vector-DMA cache-XOR engine comprises an XOR Register that reads buffers 1 cache-line at a time and an XOR unit that computes a plurality of parities and writes to L1-cache, wherein a number of writes per rebuild is equal to 2 times the number of parities times the number of storage device read/write operations.

11. The network component of claim 4, wherein the vector-DMA cache-XOR engine comprises a plurality of XOR units operating in parallel and wherein a number of writes to L1-cache read/write operations is equivalent to the number of XOR units operating in parallel.

12. A method for utilizing programmable vector-direct memory access (DMA) cache-exclusive-or (XOR) engine (VDXe) for convolution erasure coding, the method comprising:
   determining with the VDXe a plurality of parities in a round-robin fashion by reading N fragments from one local buffer and N−1 fragments received from a remote direct memory access (rDMA) packet scatter around a plurality of buffer pools and pointed to by a plurality of rDMA scatter-gathering (SG) chains, where N is a positive integer; and
   recovering with the VDXe data loss in a storage cluster by a zero-copy packet-by-packet exclusive OR (XOR) operation on received rDMA packets pointed to by the SG chains.

13. The method of claim 12, wherein the recovering comprises parsing all the received rDMA packets pointed to by the SG chains as a zero-copy receiver and XORing the received rDMA packets in data fragments in a round-robin fashion.

14. The method of claim 12, wherein each of a plurality of nodes writes a plurality of equal sized data blocks to external dual in-line memory modules (DIMMs) by reading a random array of independent discs (RAID) storage cluster.

15. The method of claim 12, further comprising generating offset-addresses to fetch the data for a plurality of exclusive OR operations cache-line by cache-line.

16. The method of claim 12, further comprising using shared caches to perform XOR operations.

17. The method of claim 16, further comprising pausing the XOR operations of multi-threading tasks and save all the shared caches to external memories for future continuation of the XOR operations.

18. The method of claim 16, wherein the shared cache comprise at least two of address-cache, scratch-cache, and input-cache.

19. The method of claim 16, wherein a done code causes all read/write threads to close and releases all the shared cache resources.

20. The method of claim 12, wherein N is greater than M, where M is a positive integer and is equal to a parity utilized by a multiple parities convolution code (MPCC) erasure coding.

21. The method of claim 12, wherein the storage cluster comprises one of a redundant array of independent disk (RAID) storage clusters and a geo-distributed sites cloud storage cluster.

22. A method for utilizing programmable vector-direct memory access (DMA) cache-exclusive-or (XOR) hardware for convolution erasure coding, the method comprising:
   computing, by the vector DMA cache-XOR hardware, parities for the convolution erasure encoding;
   computing, by the vector DMA cache-XOR hardware, syndromes for the convolution erasure decoding; and
   performing, by the vector DMA cache-XOR hardware, cross-syndrome iterations to one of recover and rebuild the erasure lost data in a unit-by-unit fashion, wherein a processing unit comprises a cache-line or a double cache-line,
   wherein a programmable DMA cache-XOR engine (VDXe) builds fine-scatter of 128×8 KB rDMA scatter-gathering (SG)-chains as 128 of concurrent rDMA transfers to support the cache-XOR without large buffers.

23. The method of claim 22, further comprising pausing the performing cross-syndrome iterations to recover erasure lost data.

24. The method of claim 23, saving all cache data into external memories for future continuation of cross-syndrome iterations.

25. The method of claim 22, wherein the performing cross-syndrome iterations comprises spreading N−1 of 1 megabyte (MB) remote direct memory access (rDMA) sequential block transfers into 128 interleaved 8 kilobyte (KB) packets scattering among N−1 or more of 1 MB rDMA block transfer threads to one of stream and emulate concurrent rDMA transfers, whereby a buffer size at rDMA receiver nodes for cache-exclusive-or (XOR) is reduced.

* * * * *